US009175385B2

(12) United States Patent
Kim et al.

(10) Patent No.: US 9,175,385 B2
(45) Date of Patent: Nov. 3, 2015

(54) METHOD FOR PREPARING METAL-CARBON COMPOSITE OF CORE-SHELL STRUCTURE THROUGH SIMULTANEOUS VAPORIZATION AND METAL-CARBON COMPOSITE OF CORE-SHELL STRUCTURE PREPARED THEREBY

(71) Applicant: Korea Institute of Energy Research, Daejeon (KR)

(72) Inventors: Hee-Yeon Kim, Daejeon (KR); Seok-yong Hong, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 21 days.

(21) Appl. No.: 13/864,594

(22) Filed: Apr. 17, 2013

(65) Prior Publication Data
US 2013/0287948 A1    Oct. 31, 2013

(30) Foreign Application Priority Data

Apr. 30, 2012    (KR) .................. 10-2012-0045166

(51) Int. Cl.
C23C 16/18    (2006.01)
C23C 16/30    (2006.01)
(Continued)

(52) U.S. Cl.
CPC ............... *C23C 16/18* (2013.01); *B22F 1/0018* (2013.01); *B22F 1/02* (2013.01); *B22F 7/08* (2013.01); *B22F 9/28* (2013.01); *B82Y 30/00* (2013.01); *C23C 16/30* (2013.01)

(58) Field of Classification Search
None
See application file for complete search history.

(56) References Cited

U.S. PATENT DOCUMENTS 4,604,276 A * 8/1986 Oblas et al. ................. 423/499.2
4,814,294 A * 3/1989 West et al. ................... 438/606
(Continued)

FOREIGN PATENT DOCUMENTS

CN    101954480 A    1/2011
JP    2008-266141 A    11/2008
(Continued)

OTHER PUBLICATIONS

Panchakarla, Bull Mater Sci vol. 30 No. 1 Feb. 2007.*
(Continued)

*Primary Examiner* — Joseph Miller, Jr.
(74) *Attorney, Agent, or Firm* — Westman, Champlin & Koehler, P.A.; Amanda M. Prose

(57) ABSTRACT

A method of preparing a metal-carbon composite of a core-shell structure through simultaneous vaporization, in which a metal particle constitutes a core and carbon constitutes a shell, with the metal-carbon composite prepared in the form of powder and supported on a supporter, and a metal-carbon composite of a core-shell structure prepared by the same. In these methods, the metal-carbon composite of the core-shell structure is prepared through simultaneous vaporization of metal and carbon precursors and does not require separate post-processing. Further, in the metal-carbon composite of the core-shell structure prepared by these methods, a carbon shell covers a portion or the entirety of a surface of a metal core, whereby the metal particles can be prevented from suffering agglomeration, separation or corrosion when subjected to harsh process conditions at high temperatures for long durations under strong acid and alkali conditions, thereby providing high performance and high durability.

16 Claims, 2 Drawing Sheets

(51) Int. Cl.
*B22F 1/00* (2006.01)
*B22F 1/02* (2006.01)
*B22F 7/08* (2006.01)
*B22F 9/28* (2006.01)
*B82Y 30/00* (2011.01)

(56) References Cited

U.S. PATENT DOCUMENTS

| | | | |
|---|---|---|---|
| 6,761,870 B1* | 7/2004 | Smalley et al. | 423/447.3 |
| 8,623,470 B2 | 1/2014 | Luhrs et al. | |
| 2001/0054769 A1* | 12/2001 | Raaijmakers et al. | 257/758 |
| 2002/0127170 A1* | 9/2002 | Hong et al. | 423/447.3 |
| 2006/0193978 A1* | 8/2006 | Toth | 427/212 |
| 2007/0281086 A1* | 12/2007 | Hsiao | 427/249.1 |
| 2008/0213189 A1* | 9/2008 | Lee et al. | 424/9.32 |
| 2012/0068156 A1* | 3/2012 | Koley | 257/14 |

FOREIGN PATENT DOCUMENTS

| | | |
|---|---|---|
| JP | 2010-001563 A | 1/2010 |
| KR | 100522762 B1 | 10/2005 |
| KR | 1020110139994 A | 12/2011 |
| WO | 2007/095454 A2 | 8/2007 |

OTHER PUBLICATIONS

Rao, Materials Res. Innovations, V2, No. 3, Nov, 1998, p. 128-141.*
www.sciencedirect.com, "Colloids and Surfaces A: Physicochemical and Engineering Aspects", Jul. 15, 2005, vol. 262, Issues 1-3, pp. 52-56.
Zheng et al, "Ionic surfactant-mediated synthesis of Pt nanoparticles/nanoporous carbons composites", Colloids and Surfaces A: Physiochemical and Engineering Aspects, vol. 262, 2005, pp. 52-56.
Notice of Allowance dated Dec. 29, 2014 for corresponding Chinese Patent Application No. 201310145660.4, filed Apr. 25, 2013, 8 pages.
Office Action dated Mar. 24, 2014 for corresponding Korean Patent Application No. 10-2012-0045166, filed Apr. 30, 2012, 5 pages.

* cited by examiner

METHOD FOR PREPARING METAL-CARBON COMPOSITE OF CORE-SHELL STRUCTURE THROUGH SIMULTANEOUS VAPORIZATION AND METAL-CARBON COMPOSITE OF CORE-SHELL STRUCTURE PREPARED THEREBY

CROSS-REFERENCE TO RELATED APPLICATION(S)

This Application claims priority to Korean Patent Application No. 10-2012-0045166, filed on Apr. 30, 2012.

BACKGROUND

1. Technical Field

Embodiments of the invention relate to a metal-carbon composite of a core-shell structure and a method of preparing the same, and more particularly, to a method of preparing a metal-carbon composite of a core-shell structure through simultaneous vaporization, in which a metal particle constitutes a core and carbon constitutes a shell, such that the metal-carbon composite can be prepared in the form of a powder and supported by a supporter, and a metal-carbon composite of a core-shell structure prepared by the same.

2. Description of the Related Art

In recent years, with increasing depletion of noble metal resources, various studies have been conducted into noble metal catalysts having various functions while improving catalyst durability. Despite superior catalytic activity to other metal catalysts, noble metal catalysts have a problem of very high preparation costs. Thus, a technology for preparing noble metal nanoparticles and achieving high dispersion of the noble metal nanoparticles is suggested. In addition, there is an attempt to overcome severe deterioration in durability of noble metal catalysts, which occurs due to separation of metal particles from a composite during catalysis, which is formed by natural agglomeration of the metal particles with increasing temperature of the catalysis.

To solve such problems, the present invention provides a method of preparing a metal-carbon composite of a core-shell structure by producing noble metal nanoparticles through simultaneous vaporization while forming a carbon layer on a surface of the noble metal nanoparticle, whereby the metal particles can be prevented from agglomerating during high temperature catalysis and can be prevented from corroding or separating in the course of the reaction, thereby achieving considerable improvement of catalyst durability.

Tao Zheng, et al. prepared a platinum/carbon composite through carburization of a mixture of a Pt complex compound salt, surfactant, water and ethanol, and performed performance testing in CO oxidation. (see [Colloids and Surfaces A: Physicochem. Eng. Aspects 262 (2005) 52-56), "Ionic surfactant-mediated synthesis of Pt nanoparticles/nanoporous carbons composites"]) However, this method employs a solution process in which carburization of a precursor solution is performed at high temperatures, causing increase in manufacturing costs and requiring several processing stages to prepare the Pt/C composite, thereby making it difficult to simplify the overall process.

In addition, Korean Patent Publication 10-2011-0139994A discloses a method of preparing a lithium manganese oxide-carbon nano composite through mixing in an ionic solution. In this patent, the preparation of the composite requires several stages including solution reaction, crystal growth, strong acid/strong alkali treatment for removal of template components, heat treatment for alloying, and the like.

BRIEF SUMMARY

It is an aspect of the present invention to provide a method of preparing a metal-carbon composite of a core-shell structure using simultaneous vaporization, which does not suffer process alteration upon industrial scale-up for mass production, and is simpler than corresponding techniques in the related art.

It is another aspect of the present invention to provide a metal-carbon composite of a core-shell structure, which ensures high performance and high durability by preventing agglomeration, separation and corrosion of metal particles upon severe reaction at high temperatures for a long period of time in strong acid or alkali conditions.

It is a further aspect of the present invention to provide a method of preparing a metal-carbon composite of a core-shell structure, which is prepared through simultaneous vaporization suffering no process alteration upon industrial scale-up for mass production, and includes various carbonous materials, alumina, silica, zeolite, zirconia, titania, or the like as a supporter with high performance and high durability to be effectively applied to most catalysis processes employing existing heterogeneous catalysts.

It is yet another aspect of the present invention to provide a metal-carbon composite having excellent performance and high durability, which includes a core-shell nano composite supported on a surface or in an air cell of a supporter such as carbonous materials, alumina, silica, zeolite, zirconia, titania, and the like, to be effectively applied to most catalysis processes employing existing heterogeneous catalysts.

In accordance with one aspect of the present invention, a method of preparing a metal-carbon composite of a core-shell structure includes: (S1) providing a metal precursor and an organic precursor for forming a carbon frame, both the metal precursor and the organic precursor being vaporized in corresponding vaporizers; (S2) supplying each of the vaporized metal precursor and the vaporized organic precursor to a reactor using a carrier gas, while preventing the vaporized metal precursor and the vaporized organic precursor from contacting each other; and (S3) heating the reactor and maintaining the reactor at a constant temperature to synthesize a metal-carbon composite.

In accordance with another aspect of the present invention, a metal-carbon composite of a core-shell structure include a metal forming a core and carbon forming a shell, wherein the shell surrounds a portion or the entirety of the core.

In accordance with a further aspect of the present invention, a method of preparing a metal-carbon composite of a core-shell structure supported on a supporter includes: (S1) placing a supporter within a reactor; (S2) providing a metal precursor and an organic precursor for forming a carbon frame, both the metal precursor and the organic precursor being vaporized in corresponding vaporizers; (S3) supplying each of the vaporized metal precursor and the vaporized organic precursor to the reactor containing the supporter by a carrier gas, while preventing the vaporized metal precursor and the vaporized organic precursor from contacting each other; and (S4) heating the reactor and maintaining the reactor at a constant temperature to synthesize a metal-carbon composite supported on the supporter.

In accordance with yet another aspect of the present invention, a metal-carbon composite of a core-shell structure is supported on a supporter, and includes a metal forming a core and carbon forming a shell, wherein the shell surrounds a portion or the entirety of the core.

According to embodiments of the invention, the metal-carbon composite of the core-shell structure is prepared through simultaneous vaporization of metal and carbon precursors, may have various properties through adjustment of synthesis temperatures and compositions, and does not require a separate post-process, thereby enabling process simplification.

BRIEF DESCRIPTION OF DRAWINGS

The above and other aspects, features and advantages of the invention will become apparent from the following description of embodiments given in conjunction with the accompanying drawings, in which.

DETAILED DESCRIPTION

Figure 1:
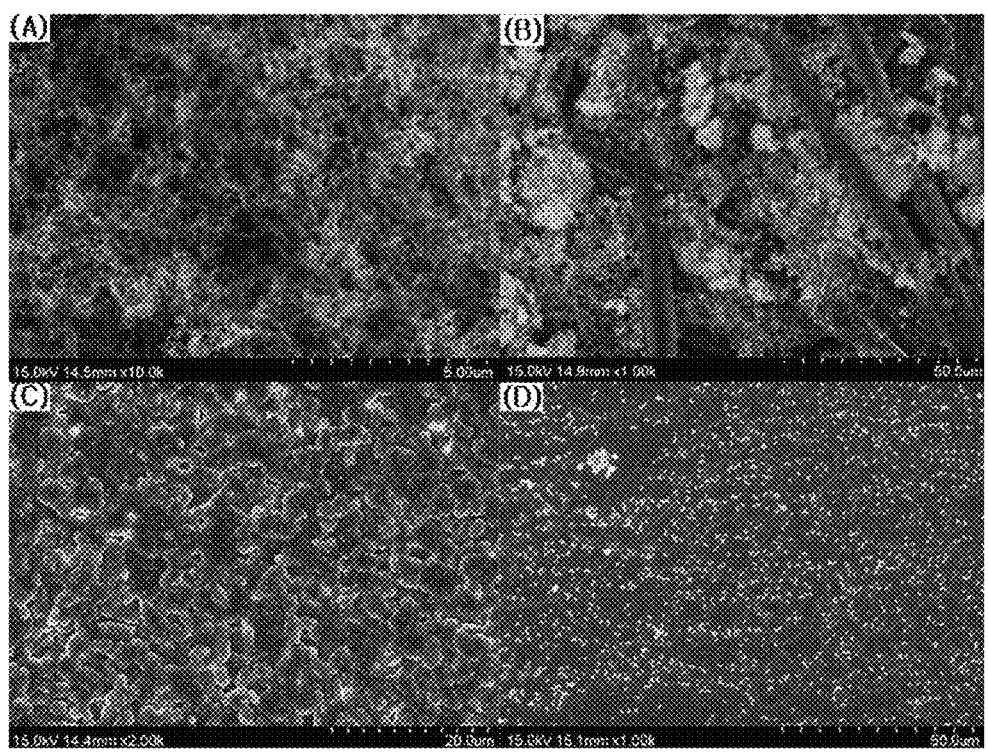
FIG. 1 shows SEM (scanning electronic microscope) micrographs of a platinum-carbon composite of a core-shell structure prepared in Example 1 and platinum-carbon composites of a core-shell structure supported on supporters prepared in Examples 2 to 4.

Embodiments of the present invention will now be described with reference to the accompanying drawings.

In accordance with one aspect of the invention, a metal-carbon composite of a core-shell structure may be prepared in the form of independent powder through simultaneous vaporization. Specifically, a method of preparing a metal-carbon composite of a core-shell structure includes: (S1) providing a metal precursor and an organic precursor for forming a carbon frame, both the metal precursor and the organic precursor being vaporized in corresponding vaporizers; (S2) supplying each of the vaporized metal precursor and the vaporized organic precursor to a reactor using a carrier gas, while preventing the vaporized metal precursor and the vaporized organic precursor from contacting each other; and (S3) heating the reactor and maintaining the reactor at a constant temperature to synthesize a metal-carbon composite.

First, a metal precursor and an organic precursor for forming a carbon frame are provided in a vapor phase from corresponding vaporizers, respectively (in Operation S1).

In this operation, after supplying the metal precursor and the organic precursor for forming a carbon frame to the corresponding vaporizers, each of the vaporizers is heated to a temperature near the boiling point of each of the precursors to achieve simultaneous vaporization of the metal precursor and the organic precursor. When the organic precursor is used in a gaseous phase, the organic precursor can be supplied into the corresponding vaporizer without a separate vaporization process.

The metal precursor is a precursor of a metal that will constitutes a core of a final heterogeneous composite, and may be selected from any material capable of being vaporized. The metal precursor may be selected from the group consisting of a platinum precursor, a palladium precursor, a ruthenium precursor, a nickel precursor, a cobalt precursor, a molybdenum precursor, and a gold precursor. The platinum precursor may be selected from among trimethyl(methylcyclopentadienyl)platinum(IV)), platinum(II) acetylacetonate, tetrakis(trifluorophosphine) platinum(0), tetrakis(triphenylphosphine) platinum(0), platinum(II) hexafluoroacetylacetonate, trimethyl(methylcyclopentadienyl) platinum (IV), and (1,5-cyclooctadiene)dimethylplatinum(II). The palladium (Pd) precursor may be selected from among palladium(II) acetate, hexafluoroacetylacetonate palladium(II), and palladium(II) acetylacetonate. The ruthenium(Ru) precursor may be selected from among ruthenium acetylacetonate, bis(ethylcyclopentadienyl)ruthenium(II), bis(cyclopentadienyl)ruthenium(II), and tris(2,2,6,6-tetramethyl-3,5-heptanedionato)ruthenium(III). The nickel (Ni) precursor may be selected from among nickel(II) acetylacetonate, bis (cyclopentadienyl) nickel, and tetrakis(trifluorophosphine)nickel. The cobalt (Co) precursor may be selected from among cobalt(II) acetylacetonate, dicarbonylcyclopentadienyl cobalt(I), cobalt carbonyl, and cyclopentadienyl dicarbonylcobalt(I). The molybdenum (Mo) precursor may be selected from among molybdenum hexacarbonyl and molybdenum (V) chloride, and the gold (Au) precursor may be methyl (triphenylphosphine)gold(I). Since these metal precursors may be vaporized under different conditions and temperatures, there is a need for suitable adjustment.

The organic precursor is a precursor of carbon which will constitute a shell of the final heterogeneous composite, and may be selected from hydrocarbon-based precursors containing carbon. The organic precursor may be a liquid precursor selected from the group consisting of methanol, ethanol, acetone, benzene, toluene and xylene. Alternatively, the organic precursor may be a gaseous precursor, such as methane or acetylene.

The vaporizers used in this operation may be any vaporizer known in the art, or may be directly manufactured. Generally, the vaporizers may be formed of metal or vitreous materials such as quartz glass, Pyrex, and the like. Advantageously, the vaporizers may be made of the vitreous material in that an operator can advantageously check the properties and remaining amounts of the precursors in the vaporizers while maintaining the vaporizers at constant temperature, and in that the vitreous material does not react with the precursors, thereby ensuring process stability.

In this operation, detailed conditions for vaporization of the precursors depend on the kind of precursor selected. In one embodiment, (trimethyl)methylcyclopentadienyl platinum may be used as the platinum precursor and acetone may be used as the organic precursor. In this case, vaporization of the platinum precursor may be achieved at 50~70° C. and vaporization of the organic precursor may be achieved at 50~60° C. In another embodiment, (1,5-cyclooctadiene)dimethylplatinum(II) may be used as the platinum precursor. In this case, vaporization of the platinum precursor may be achieved by dissolving the platinum precursor in a solvent such as benzene and heating the resultant to a temperature of 100° C. or more.

Then, each of the metal precursor and the organic precursor vaporized in Operation S1 is supplied to a reactor by a carrier gas, while preventing the vaporized metal precursor and the vaporized organic precursor from contacting each other (Operation S2).

In this operation, each of the vaporized precursors is supplied to the reactor by a carrier gas containing the vaporized precursor in a non-contact state, for example, through separate supply lines. As a result, the vaporized precursors meet each other at an inlet of the reactor, in which final reaction will occur. When the precursors meet each other in a transfer channel to the reactor, there is a probability of undesirable sub-reaction or coating to a wall of the transfer channel.

The carrier gas used in this operation prevents agglomeration or sub-reaction of the precursors, and may be selected from among nitrogen, argon, helium, oxygen, hydrogen, and the like. Advantageously, inert gas such as nitrogen, argon, helium, and the like may be used as the carrier gas. Alternatively, oxygen or hydrogen may be used according to the kind of precursor.

In this operation, the properties of a final composite may be controlled by regulating the flux ratio of the precursors supplied to the reactor. For example, the metal-carbon composite tends to be more reduced in thickness of the carbon shell and the number of graphite layers in the case where the flux ratio of the metal precursor to the organic precursor is 2:1 than in the case where the flux ratio of the metal precursor to the organic precursor is 1:1. Thus, various metal-composites may be prepared by changing the flux ratio according to catalysis to be applied.

In one embodiment, each of the precursors vaporized in an oven maintained at a constant temperature is transferred to the reactor through a gas transfer channel, which is wound by a heat line to prevent condensation of the vaporized precursors. Here, each of the precursors may be maintained at a temperature near the boiling point thereof while being supplied to the reactor.

Finally, the reactor to which the precursors are supplied in Operation S2 is heated to and maintained at a predetermined temperature to prepare a metal-carbon composite of a core-shell structure in the form of a powder (in Operation S3). In this operation, the reaction conditions for synthesis of the metal-carbon composite of the core-shell structure are determined according to the kind of precursor, that is, the kind of metal or organic precursor. Synthesis of the metal-carbon composite may be efficiently carried out at a temperature of about 300° C. or more, preferably at a temperature of 300~1800° C. However, it should be understood that the synthesis temperature can be suitably determined according to design of a heating furnace and the reactor. For example, when a quartz glass reactor is used, the synthesis temperature may be determined in the range of 300~1100° C. Further, when an alumina tube or a graphite reactor is used, the synthesis temperature may be set up to 1800° C. Furthermore, the synthesis of the metal-carbon composite may be carried out at a temperature of 1800° C. or more by suitable design of the heating furnace and the reactor. As synthesis temperature increases, the shell surrounding the metal particle has fewer defects and improved crystallinity. Synthesis of the metal-carbon composite may be performed for 5 minutes or more, preferably for about 1 hour. However, it is apparent that the amount of the metal-carbon composite increases with increasing synthesis duration.

The metal-carbon composite synthesized by the method according to this embodiment has a core-shell structure in which a metal constitutes the core and carbon constitutes the shell, which surrounds a portion or the entirety of the core.

When applied to general molecular catalysis, the composite according to this embodiment may have a core-shell structure in which the shell surrounds a portion of the core. That is, the composite of the core-shell structure has a partial shell defect, thereby allowing smooth movement of reactants and products in catalysis. In addition, when the composite according to this embodiment is applied to electrode materials for fuel batteries or rechargeable batteries, the composite of the core-shell structure has a core-shell structure in which the shell surrounds the entirety of the core to allow efficient movement of ions or electrons. That is, it is advantageous that the composite have a smooth carbon shell, which is free from defects, such as graphine. In the composite according to this embodiment, the carbon shell covers a portion or the entirety of the surface of the metal core, whereby the composite does not suffer from agglomeration, separation or corrosion of the metal particles even in a severe process at high temperatures for long durations under acid or alkali conditions, thereby ensuring high performance and high durability.

In accordance with another aspect of the invention, a metal-carbon composite of a core-shell structure may be prepared in the form of being supported on a supporter through simultaneous vaporization. Specifically, a method of preparing a metal-carbon composite of a core-shell structure supported on a supporter includes: (S1) placing a supporter within a reactor; (S2) providing a metal precursor and an organic precursor for forming a carbon frame, both the metal precursor and the organic precursor being vaporized in corresponding vaporizers; (S3) supplying each of the vaporized metal precursor and the vaporized organic precursor to the reactor containing the supporter using a carrier gas, while preventing the vaporized metal precursor and the vaporized organic precursor from contacting each other; and (S4) heating the reactor and maintaining the reactor at a constant temperature to synthesize a metal-carbon composite supported by the supporter.

In the present invention, the supporter may be selected from the group consisting of carbonous materials such as carbon paper, activated carbon, carbon black, and the like, alumina materials such as alumina powder, alumina sheets, and the like, silica powder, titania powder, zirconia powder, zeolites, metal foils such as nickel and aluminum foils, and the like, without being limited thereto. Since a supporter having a large surface area can maximize the supporting effect, a supporter such as carbon powder, alumina powder, zeolite powder, and the like may be used in preparation of the metal core-carbon shell structure, which in turn will be applied to various catalysts for reactions such as modification, pyrolysis, hydrogenation/dehydrogenation, and the like.

The composite synthesis method of this embodiment is different than the above embodiment in that the supporter is previously placed inside the reactor and the composite is then synthesized on the supporter to prepare a final product, that is, the metal-carbon composite of the core-shell structure supported on the supporter. Here, it should be noted that Operations S2 to S4 are the same as those of the method of the above embodiment.

The method according to this embodiment may provide a metal-carbon composite supported on the supporter and having a core-shell structure, in which a metal constitutes the core and carbon constitutes the shell surrounding a portion or the entirety of the core. When applied to general molecular catalysis in a vapor phase, the composite according to this embodiment may have a core-shell structure in which the shell surrounds a portion of the core, that is, a core-shell structure in which the shell has a defect. In this embodiment, the composite is supported on the supporter, thereby allowing easy collection of the catalyst after completion of the catalysis. Particularly, the composite supported on the supporter is advantageous when applied to catalysis in monolith, honeycomb, or micro-channel reactors, membrane reactors, packed-bed reactors, and the like. Furthermore, the composite according to the invention can be easily applied to various adsorption/desorption processes when supported on an existing absorbent.

The present invention will be illustrated in more detail with reference to some examples. However, it should be understood that these examples are provided for illustration only, and that various modifications, variations, and alterations can be made without departing from the spirit and scope of the invention. Therefore, the scope of the invention should be limited only by the accompanying claims and equivalents thereof.

Example 1

Preparation of Platinum-Carbon Composite of Core-Shell Structure

Methylcyclopentadienylplatinum (MeCpPtMe$_3$) was used as a platinum precursor, and acetone (99.8%, Merck) was used as the carbon precursor. With a quartz filter placed inside a quartz tube (½ inch) to collect a metal-carbon composite, nitrogen was supplied into the tube at 120° C. for 2 hours to remove moisture and impurities from the specimen. Here, with stopcocks for inflow and outflow closed, each of two vaporizers placed inside an oven was maintained in a nitrogen atmosphere, and nitrogen was supplied for 30 minutes or more through a bypass line, which does not pass through the vaporizers, to remove impurities from the reactor.

Next, the temperature of the reactor was increased to 400° C. at a temperature increase rate of 10° C./min to provide conditions for synthesis of the composite. Here, when the temperature of the reactor reached a final reaction temperature, the temperature of Oven 1 in which the vaporizer containing the platinum precursor was placed was increased to 60° C. and the temperature of Oven 2 in which the vaporizer containing acetone was placed was increased to 55° C. When the temperature of each of the precursors and the reactor reached a final predetermined temperature, the stopcocks of the respective vaporizers were opened to allow a carrier gas to flow into the reactor together with the vaporized precursor. At this time, nitrogen was supplied as the carrier gas at 20 sccm and at 10 sccm to a line passing through Oven 1 containing the platinum precursor and to a line passing through Oven 2 containing acetone, respectively. In addition, nitrogen was supplied at 20 sccm to a line separately connected to the reactor. After opening the stopcocks of the vaporizers, reaction was carried out for 1 hour, thereby preparing a platinum-carbon composite of a core-shell structure.

Examples 2 to 4

Preparation of Platinum-Carbon Composite of Core-Shell Structure Supported on Supporter Methylcyclopentadienylplatinum (MeCpPtMe$_3$) was used as a platinum precursor, and acetone (99.8%, Merck) was used as the carbon precursor. With a quartz filter placed inside a quartz tube (½ inch) to collect a metal-carbon composite, a 10 mm×10 mm piece of carbon paper (Example 2), an alumina sheet of 10 mm×10 mm (Example 3), and a Ni foil sheet of 10 mm×10 mm (Example 4) were placed above the quartz filter. Further, nitrogen was supplied into the tube at 120° C. for 2 hours to remove moisture and impurities from the specimens. Here, with stopcocks for inflow and outflow closed, each of two vaporizers placed inside an oven was maintained in a nitrogen atmosphere, and nitrogen was supplied for 30 minutes or more through a bypass line, which does not pass through the vaporizers, to remove impurities from the reactor.

Next, the temperature of the reactor was increased to 400° C. at a temperature increase rate of 10° C./min to provide conditions for synthesis of a composite. Here, when the temperature of the reactor reached a final reaction temperature (carbon paper: 400° C., alumina sheet: 400° C., Ni foil: 400° C.), the temperature of Oven 1 in which the vaporizer containing the platinum precursor was placed was increased to 60° C. and the temperature of Oven 2 in which the vaporizer containing acetone was placed was increased to 55° C. When the temperature of each of the precursors and the reactor reached a final predetermined temperature, the stopcocks of the respective vaporizers were opened to allow a carrier gas to flow into the reactor together with the vaporized precursor. At this time, nitrogen was supplied as the carrier gas at 20 sccm and at 10 sccm to a line passing through Oven 1 containing the platinum precursor and to a line passing through Oven 2 containing acetone, respectively. In addition, nitrogen was supplied at 20 sccm to a line separately connected to the reactor. After opening the stopcocks of the vaporizers, reaction was carried out for a predetermined period of time (carbon paper: 1 hour, alumina sheet: 1 hour, Ni foil: 1 hour), thereby preparing platinum-carbon composites having a core-shell structure.

Experimental Example 1

SEM Analysis

A platinum-carbon composite of a core-shell structure (A) prepared in Example 1 and platinum-carbon composites of a core-shell structure supported on supporters (B, C, D) prepared in Examples 2 to 4 were analyzed using a scanning electronic microscope (SEM). Results are shown in FIG. 1. Consequently, the Pt—C composites were found to be formed on the surfaces of the carbon paper, the alumina sheet and the Ni foil. In particular, the carbon paper provided a greater amount of Pt—C composite than other samples. On the Ni foil, the particle size of Pt was greater than in other cases.

Experimental Example 2

TEM Analysis

Figure 2:
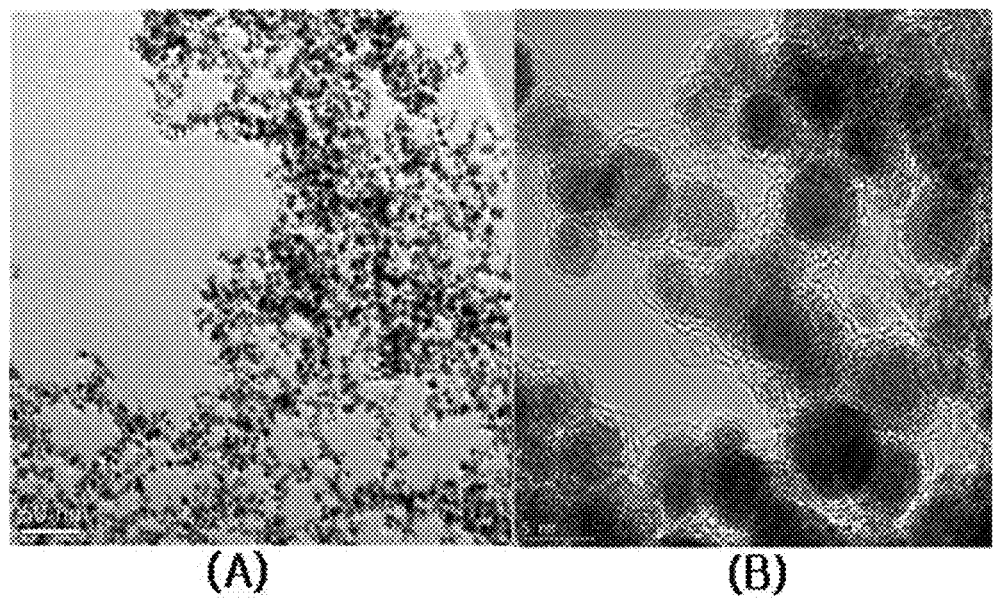
FIG. 2 shows TEM (transmission electronic microscope) micrographs of a platinum-carbon composite of a core-shell structure supported on carbon paper prepared in Example 2.

The platinum-carbon composite of the core-shell structure prepared in Example 1 was analyzed using a transmission electronic microscope (TEM). Results are shown in FIG. 2. FIG. 2A is a TEM micrograph showing general distribution of composite particles, and FIG. 2B is an enlarged micrograph showing a detailed structure of the composite particles. From FIG. 2, it can be seen that the platinum-carbon composites prepared in the inventive examples have a core-shell structure in which platinum is placed at the center of the structure to form the core and carbon, that is, a graphite layer, is placed around the core to form the shell. The carbon shell surrounding the core generally consists of 1 to 5 graphite layers, and the defect degree of the carbon shell can be regulated by controlling the synthesis temperature. In addition, the composite has a particle size of about 2~5 nm. That is, the higher the temperature in preparation of the core-shell structure, the fewer defects and the smoother the surface the carbon shell has. Further, the thickness of the carbon shell decreases with decreasing ratio of the flux of the organic precursor to the flux of the metal precursor. However, the shape of the carbon shell may vary depending not only on the flux of carbon but also the kind of organic precursor. Namely, in the case where the organic precursor has a small number of carbons, like methane, the composite has a smaller number of carbon shells than in the case where the organic precursor was acetylene or alcohol. Such a metal-carbon core-shell structure provides reaction conditions that permit easy movement of gas molecules, ions and electrons while preventing corrosion of the platinum particles.

As such, according to embodiments of the invention, in a metal-carbon composite of a core-shell structure, a carbon shell covers a portion or the entirety of the surface of a metal core, whereby metal particles can be prevented from suffering agglomeration, separation or corrosion when applied to severe reaction at high temperatures for long durations under strong acid or alkali conditions, thereby ensuring excellent performance and high durability. The metal-carbon composite of the core-shell structure according to the embodiments may be applied to various industrial fields. Specifically, the metal-carbon composite of the core-shell structure may be applied to catalyst materials, channel type catalyst reactors based on these catalyst materials such as monolith or honeycomb reactors, various separator materials, absorbents and adsorbents, and the like.

Although some embodiments have been provided to illustrate the present invention, it should be understood that these embodiments are given by way of illustration only, and that various modifications, variations, and alterations can be made without departing from the spirit and scope of the present invention. The scope of the present invention should be limited only by the accompanying claims and equivalents thereof.

What is claimed is:

1. A method of preparing a metal-carbon composite of a core-shell structure, comprising:
   (S1) providing a metal precursor to a first vaporizer and an organic precursor to a second vaporizer for forming a carbon frame wherein the metal precursor is a precursor of a metal for forming a metal core of the core-shell structure, and the organic precursor is a precursor for forming a carbon shell surrounding the metal core and the carbon shell comprising at least one graphite layer, both the metal precursor and the organic precursor passing through the corresponding vaporizers in order to be supplied to a reactor in vaporized state;
   (S2) supplying each of the vaporized metal precursor and the vaporized organic precursor to a reactor by a respective carrier gas, while preventing the vaporized metal precursor and the vaporized organic precursor from contacting each other prior to introducing each of the vaporized precursors to the reactor by supplying the vaporized metal precursor through a first supply line passing from the first vaporizer to the reactor and simultaneously supplying the vaporized organic precursor through a second supply line passing from the second vaporizer to the reactor, the first and second supply lines separately connected to the reactor;
   (S3) heating the reactor and maintaining the reactor at a constant temperature to synthesize a metal-carbon composite;
   wherein the metal precursor is at least one selected from the group consisting of a platinum precursor, a palladium precursor, a nickel precursor, a molybdenum precursor and a gold precursor; and
   wherein the platinum (Pt) precursor is selected from the group consisting of trimethyl(methylcyclopentadienyl) platinum(IV)), platinum(II) acetylacetonate, tetrakis (trifluorophosphine) platinum(0), tetrakis-(triphenylphosphine)platinum(0), platinum(II) hexafluoroacetylacetonate, trimethyl-(methylcyclopentadienyl) platinum(IV) and (1,5-cyclooctadiene)dimethylplatinum(I);
   the palladium (Pd) precursor is palladium(II) acetate, hexafluoro-acetylacetonate palladium(II) or palladium (II) acetylacetonate;
   the nickel (Ni) precursor is nickel(II)acetylacetonate, bis (cyclopentadienyl) nickel, or tetrakis(trifluorophosphine)nickel;
   the molybdenum (Mo) precursor is molybdenum hexacarbonyl or molybdenum(V) chloride; and
   the gold (Au) precursor is methyl(triphenylphosphine)gold (I).

2. The method according to claim 1, wherein the organic precursor provided to the vaporizer for forming the carbon frame is a liquid precursor selected from the group consisting of methanol, ethanol, acetone, benzene, toluene, and xylene.

3. The method according to claim 1, wherein the organic precursor provided to the vaporizer for forming the carbon frame is a gaseous precursor selected from methane or acetylene.

4. The method according to claim 1, wherein the carrier gas is selected from among oxygen, hydrogen, argon, helium and nitrogen gas.

5. The method according to claim 1, wherein in S2, each of the vaporized metal precursor and the vaporized organic precursor is maintained at the temperature not below a boiling point of each precursor for maintaining precursor vaporization, while being supplied to the reactor.

6. The method according to claim 1, wherein in S3, the reactor is heated to a temperature of 300° C. or more.

7. The method according to claim 1, wherein in S3, the reactor is heated to a temperature ranging from 300° C. to 1800° C.

8. A method of preparing a metal-carbon composite of a core-shell structure supported on a supporter, comprising:
   (S1) placing a supporter within a reactor;
   (S2) providing a metal precursor to a first vaporizer and an organic precursor to a second vaporizer for forming a carbon frame wherein the metal precursor is a precursor of a metal for forming a metal core of the core-shell structure, and the organic precursor is a precursor of carbon for forming a carbon shell surrounding the metal core and comprising at least one layer of graphite, both the metal precursor and the organic precursor passing through the corresponding vaporizers in order to be supplied to the reactor in vaporized state;
   (S3) supplying each of the vaporized metal precursor and the vaporized organic precursor separately and simultaneously to the reactor containing the supporter using a carrier gas for each precursor, while preventing the vaporized metal precursor and the vaporized organic precursor from contacting each other prior to introducing each of the vaporized precursors to the reactor by using separate supply lines for each precursor, the supply lines separately connected to the reactor;
   (S4) heating the reactor and maintaining the reactor at a constant temperature to synthesize a metal-carbon composite of the core-shell structure that is supported on the supporter; and
   wherein the metal precursor is at least one selected from the group consisting of a platinum precursor, a palladium precursor, a nickel precursor, a molybdenum precursor and a gold precursor.

9. The method according to claim 8, wherein the supporter is selected from the group consisting of carbon paper, activated carbon, carbon black, alumina powder, alumina sheets, silica powder, titania powder, zirconia powder, zeolite, and metal foils of nickel or aluminum.

10. The method according to claim 8, wherein the platinum (Pt) precursor is selected from the group consisting of trimethyl(methylcyclopentadienyl)platinum(IV), platinum(II) acetylacetonate, tetrakis(trifluorophosphine) platinum(0), tetrakis(triphenylphosphine)platinum(0), platinum(II) hexafluoroacetylacetonate, trimethyl-(methylcyclopentadienyl) platinum(IV) and (1,5-cyclooctadiene)dimethylplatinum(II);
   the palladium (Pd) precursor is palladium(II) acetate, hexafluoroacetylacetonate palladium(II) or palladium (II) acetylacetonate;

the nickel(Ni) precursor is nickel(II) acetylacetonate, bis(cyclopentadienyl) nickel, or tetrakis(trifluorophosphine) nickel;

the molybdenum (Mo) precursor is molybdenum hexacarbonyl or molybdenum(V) chloride; and the gold (Au) precursor is methyl(triphenylphosphine)gold (I).

11. The method according to claim 8, wherein the organic precursor provided to the vaporizer for forming the carbon frame is a liquid precursor selected from the group consisting of methanol, ethanol, acetone, benzene, toluene and xylene.

12. The method according to claim 8, wherein the organic precursor provided to the vaporizer for forming the carbon frame is a gaseous precursor selected from methane or acetylene.

13. The method according to claim 8, wherein the carrier gas is selected from among oxygen, hydrogen, argon, helium and nitrogen gas.

14. The method according to claim 8, wherein in S3, each of the vaporized metal precursor and the vaporized organic precursor, which is supplied, is maintained at the temperature not below a boiling point of each precursor for maintaining precursor vaporization.

15. The method according to claim 8, wherein in S3, the reactor is heated to a temperature of 300° C. or more.

16. The method according to claim 8, wherein in S3, the reactor is heated to a temperature ranging from 300° C. to 1800° C.

\* \* \* \* \*